United States Patent [19]

Feinland

[11] 4,152,579
[45] May 1, 1979

[54] DIGITAL TRACKING SYSTEM WITH ANALOG SIGNAL RESOLUTION

[75] Inventor: Seymour Feinland, Stamford, Conn.

[73] Assignee: Pitney-Bowes, Inc., Stamford, Conn.

[21] Appl. No.: 864,205

[22] Filed: Dec. 27, 1977

[51] Int. Cl.² .................. G01G 3/00; H03K 21/02
[52] U.S. Cl. .................. 235/92 GC; 177/DIG. 6; 235/92 WT; 235/92 PS; 235/92 R; 250/237 G
[58] Field of Search ........ 235/92 GC, 92 PS, 92 WT, 235/92 CA, 92 V; 177/DIG. 6, DIG. 3, 185; 350/162 R; 250/237 G, 237 R

[56] References Cited

U.S. PATENT DOCUMENTS

| | | | |
|---|---|---|---|
| 3,371,335 | 2/1968 | Seewald | 235/92 GC |
| 3,661,464 | 5/1972 | Hubbard | 235/92 PS |
| 3,973,109 | 8/1976 | Foster | 177/DIG. 6 |
| 4,047,007 | 9/1977 | Dlugos | 235/92 WT |

*Primary Examiner*—Joseph M. Thesz
*Attorney, Agent, or Firm*—Peter Vrahotes; William D. Soltow, Jr.; Albert W. Scribner

[57] ABSTRACT

An optical detector provides an optically amplified function of displacement to be measured. The detector includes a first optical grating which moves with a displaceable member, while a second reticle grating is positioned in a plurality of phase displaced zones which remain fixed. The light beam is modulated by both gratings and detected by a plurality of photodetectors, each positioned behind one of the phase displaced zones. Pairs of phase displaced photodetector signals are processed at a comparator to provide a pair of phase quadrature digital waveforms for tracking the position of the displaceable member. Signal resolution is provided in the presence of zero displacement drift and vibration induced oscillation by interrogation of the photodetector signals which are filtered to provide average values. For zero displacement drift beyond system tolerance levels, a comparator senses the difference between a selected pair of analog signals as a function of amplitude, while decision edge determination in the presence of oscillation is resolved by detecting which of the filtered analog signals generating the digital waveform is greater.

10 Claims, 6 Drawing Figures

DIGITAL TRACKING SYSTEM WITH ANALOG SIGNAL RESOLUTION

BACKGROUND OF THE INVENTION

1. Field of the Invention

This invention relates to optical detection systems for displacement tracking and more particularly to a signal processing system useful in postal scale applications.

2. Brief Description of the Prior Art

Optical detectors have been used in weighing scales for the purpose of measuring scale tare structure displacement to thus provide an indication of the mass of a load supported by the tare structure. Generally, these detectors sensed the movement of one of a pair of parallel optical gratings to provide an optically amplified function of the tare structure deflection. An example of a typical scale optical detector is disclosed in the following pending application: Weighing with Moire optoelectronic Transducer, Ser. No. 653,850, filed Jan. 30, 1976 now U.S. Pat. No. 4,044,847 and assigned to the assignee of the present invention.

Signal processing systems for tracking the optically detected deflection have utilized phase quadrature displaced pulse waveform signals generated from photodetector signals. In copending application Ser. No. 715,883 filed Aug. 19, 1976 entitled Counting System, also assigned to the assignee of the present invention, an exemplary signal processing system for scale applications is shown.

Among the problems encountered in the design of production scale systems employing optical detectors and counting circuitry was that, although high resolution optical gratings were readily available, true signal resolution was dependent on allowable air gap dimensions between the movable and fixed gratings. Air gap clearance and tolerance were greatly reduced with increased optical grating resolution. This problem was not satisfactorily alleviated in the presence of collimated light source. As a result of critical air gap dimensions, optical detectors became difficult to set up and maintain. Thus, with potential accuracies of 20 microinches available over an inch of displacement, practical optical resolution due to allowable air gap considerations limited such resolution to approximately 800 to 1000 microinches.

Attempts at increasing resolution through the use of quadrature counts derived from detected waveforms did not produce adequate results and introduced sources of additional error into the system.

The use of optical detectors having relatively low resolution, yet which maintained high accuracy, had potential acceptability in decision applications such as postal scales wherein digital countup and countdown waveforms having, for example, one ounce resolution per waveform cycle could be utilized. A major drawback remained, however, in that scales were subject to both zero displacement drift and decision edge oscillation, and for such reasons a higher degree of resolution than provided by the digital waveforms derived from the optical system was required.

SUMMARY OF THE INVENTION

Phase displaced cyclic signals generated at an optical detector are utilized to derive a pair of quadrature displaced digital waveforms for tracking the position of a scale tare structure in response to a load. Resolution of oscillation about a decision edge of a digital waveform and zero drift detection are achieved by interrogation of the average values of a pair of 180° phase displaced photodetector signals from which one of the digital waveforms is derived.

From the foregoing compendium it will be appreciated that it is an object of the present invention to provide a digital tracking system of the general character described which is so constructed that it is not subject to the disadvantages aforementioned.

A further object of the present invention is to provide a digital tracking system of the general character described which permits the use of a mass producible optical detector of relatively low resolution yet provides precise determination of measured values.

A further object of the present invention is to provide a digital tracking system of the general character described for use in conjunction with an optical detector which provides accurate yet economical displacement measurement.

Yet another object of the present invention is to provide a digital tracking system of the general character described for use in conjunction with an optical detector whereby position determination is made through processing of both digital signals and analog signals.

Another object of the present invention is to provide a digital tracking system of the general character described for use in conjunction with an optical detector which is well suited for economical mass fabrication techniques.

A further object of the present invention is to provide a digital tracking system of the general character described for use in conjunction with an optical detector and which is well adapted for decision scale mass measuring applications.

Other objects of the invention in part will be obvious and in part will be pointed out hereinafter.

With these ends in view, the invention finds embodiment in certain combinations of elements, arrangements of parts and series of steps by which the objects aforementioned and certain other objects are hereinafter attained, all as fully described with reference to the accompanying drawings and the scope of which is more particularly pointed out and indicated in the appended claims.

DESCRIPTION OF THE PREFERRED EMBODIMENT

In the accompanying drawings in which is shown some of the various possible exemplary embodiments of the invention:

Figure 1:
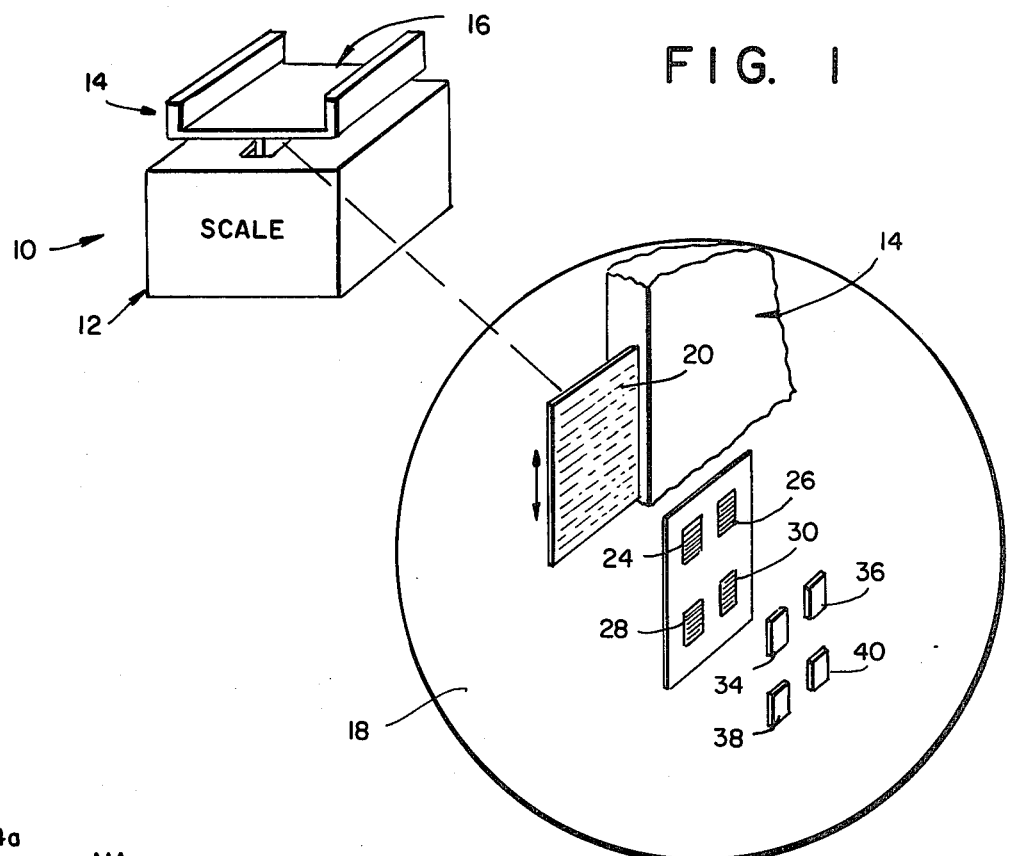
FIG. 1 is a schematized perspective illustration of a scale and showing in exploded detail, portions of a typical optical detector configured to provide an optical signal indicative of the deflection of a scale pan with the detector detail illustrating a plurality of photodetectors positioned behind phase displaced zones of a fixed grating.
Figure 6:
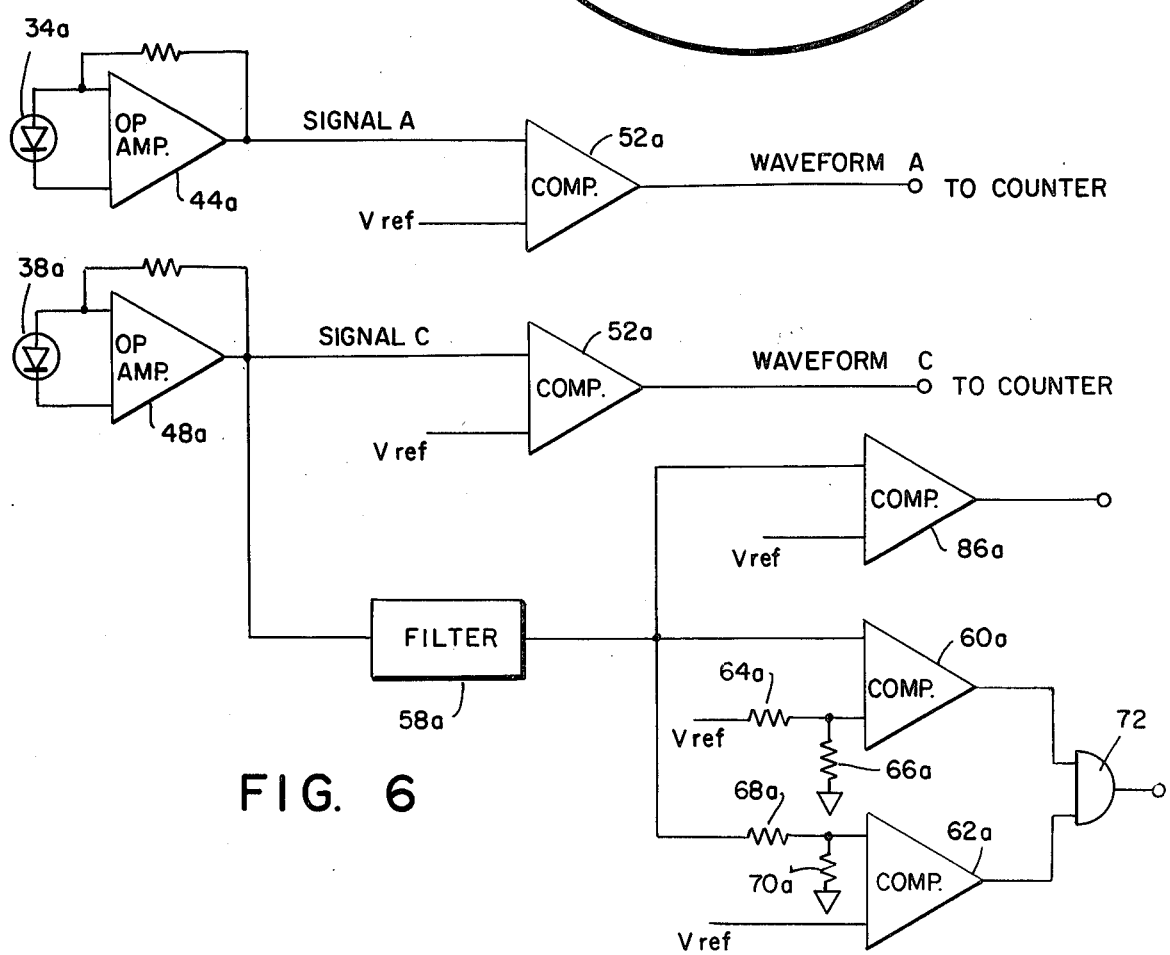
Figure 4:
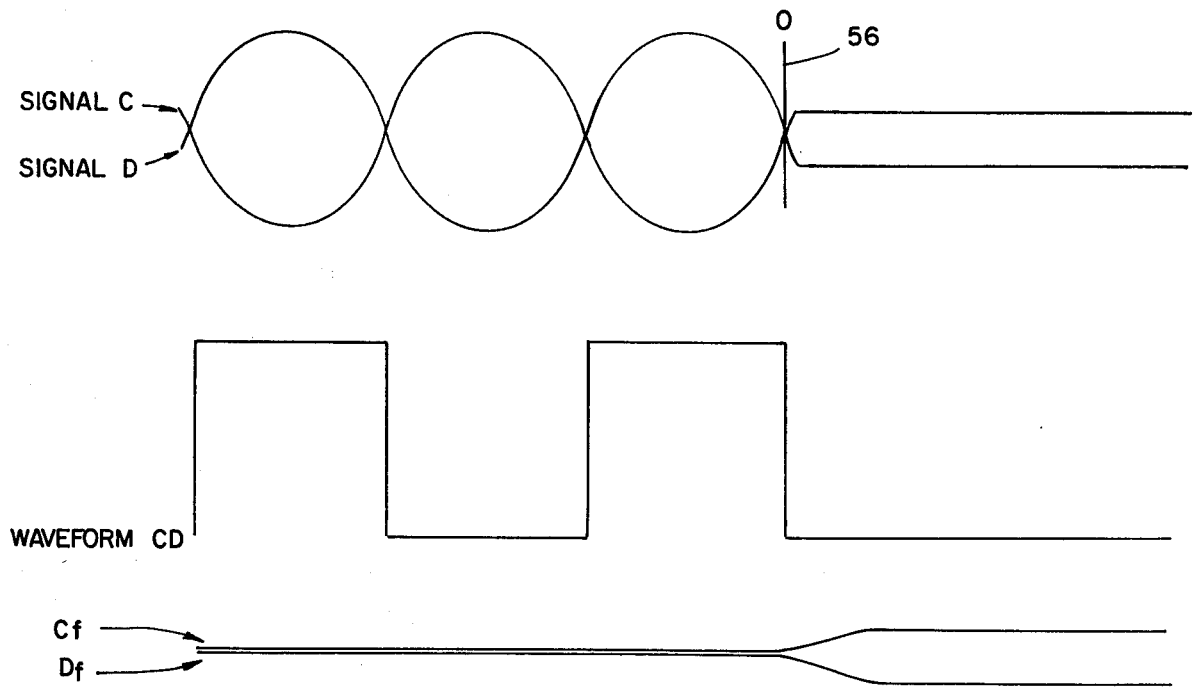
Figure 5:
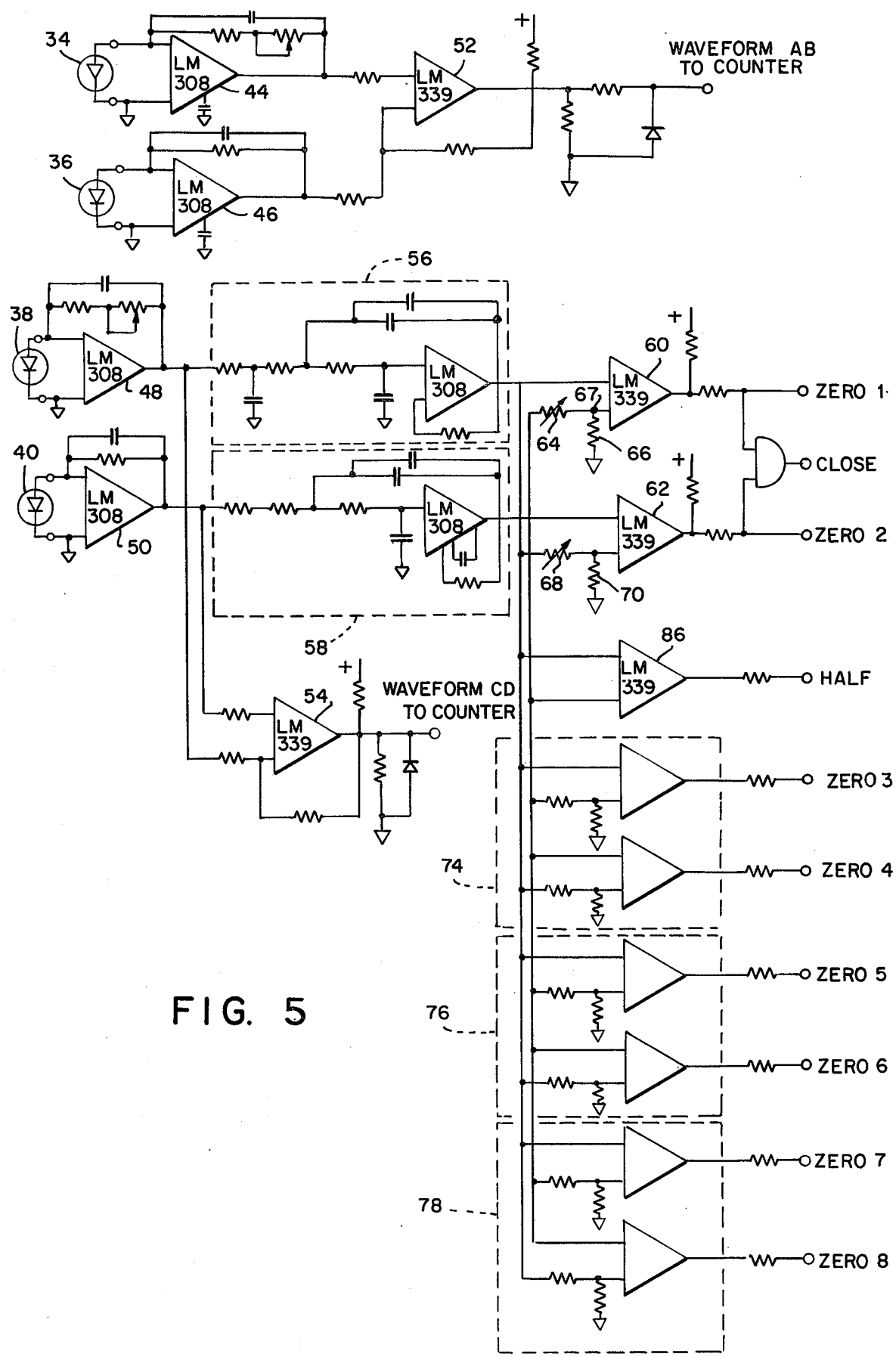

FIG. 4 illustrates a greatly enlarged portion of the two 180° phase displaced analog signals, the corresponding digital waveform and the average signal values of the analog signals to more clearly illustrate the manner in which zero drift is detected by determining the difference between the average values of the analog signals as a function of their amplitude; and FIG. 5 is a schematic diagram illustrating a typical digital tracking system with analog signal resolution constructed in accordance with the present invention; and FIG. 6 is a schematized block diagram of an alternate embodiment of the invention.

DESCRIPTION OF THE PREFERRED EMBODIMENT

Referring now in detail to the drawings, the reference numeral 10 denotes generally a scale comprising a stationary frame 12 and a tare structure 14 which includes an article supporting pan 16, the displacement of which is a direct linear function of the mass of the article placed thereon.

An optical detector 18 is utilized to generate an optical signal which is a function of the displacement of the pan 16. The detector 18 may be of conventional configuration or one such as is more particularly shown and described in copending application Ser. No. 836,762 filed Sept. 26, 1977 entitled MASS PRODUCIBLE WEIGHT MEASURING SYSTEM and assigned to the assignee of the present invention.

As more particularly described in said copending application, Ser. No. 836,762, operation of the optical detector 18 is premised upon the detection of movement of the scale tare structure 14 by modulation of a light beam (not shown) which passes through a pair of optical gratings 20, 22. The grating 20 is operably connected to the tare structure 14 for unitary movement therewith and the grating 22 is anchored to the scale frame 12.

With one of the grating sets having its gratings at a skew angle to the other, a moire interference pattern is generated; with the rulings of both gratings parallel, the interference pattern constitutes a cyclic light to dark modulation with the movable grating rulings acting as a shutter to block the light passing between the rulings of the fixed grating.

In order to detect the direction of tare displacement a plurality of photodetectors providing signals in phase quadrature is desirable. Generally, phase quadrature outputs of photodetectors were provided heretofore by accurate placement of the photodetectors. To simplify mass production of optical detectors, cirticality of photodetector placement has been reduced by dividing the fixed grating 22 into four discrete grating zones 24, 26, 28, and 30, with the rulings of zone 24 phase displaced 180° from the rulings of zone 26 and the rulings of zone 28 phase displaced 180° from the rulings of zone 30. Further, the rulings of zone 24 are phase displaced 90° from the rulings of zone 28, and the rulings of zone 26 similarly phase displaced 90° from the rulings of zone 30.

Four photodetectors 34, 36, 38, and 40 are positioned behind the phase displaced grating zones such that each of the photodetectors is registered with one of the appropriate grating zones.

Figure 2:
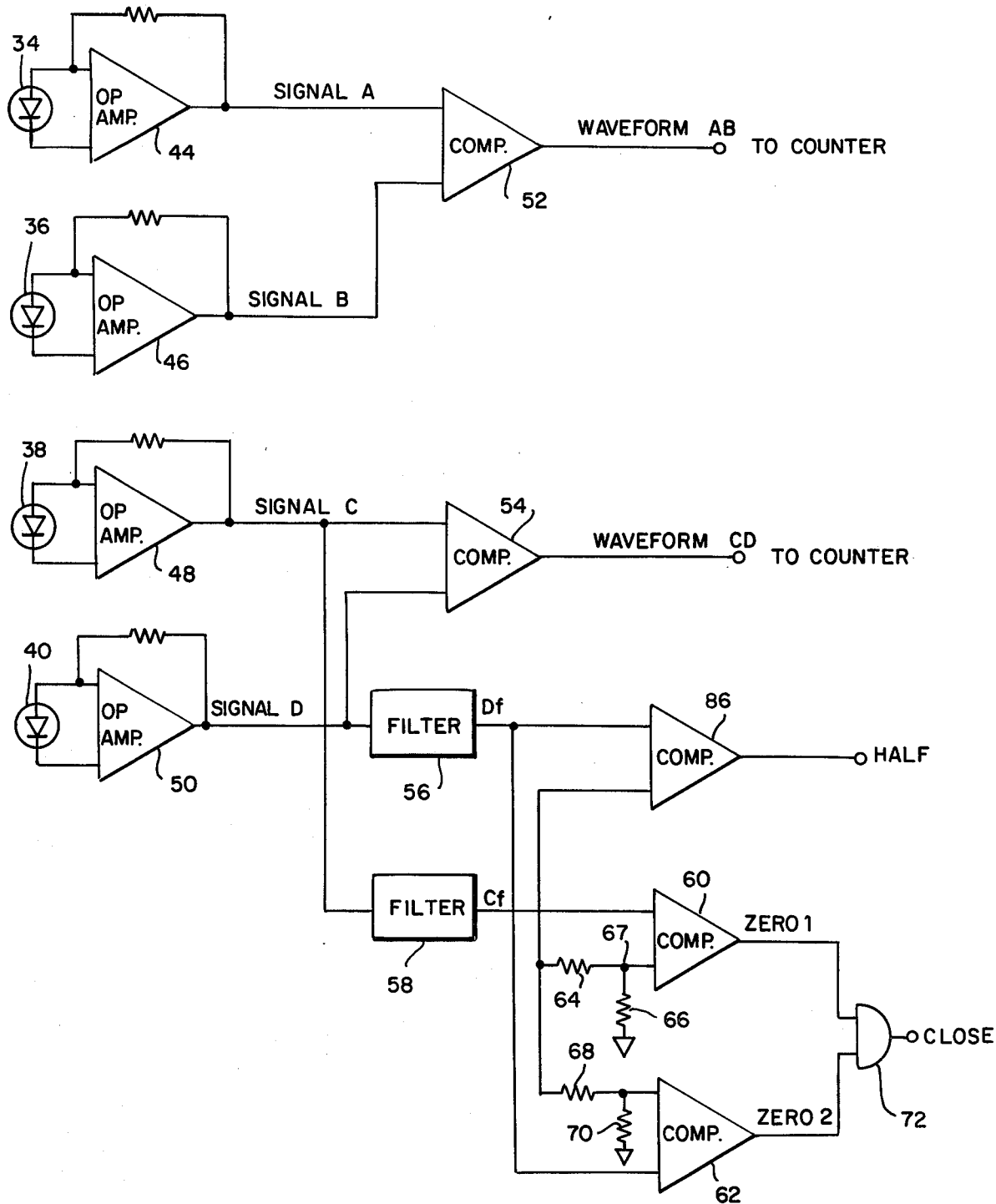
FIG. 2 is a schematized block diagram of a typical circuit employable in the tracking system of the present invention to process the photodetector signals and provide digital waveforms as well as analog signal resolution of critical areas of such waveforms.

With reference now to FIGS. 2 and 5 wherein a typical circuit employing the digital tracking system of the present invention is shown, it should be appreciated that the photodetectors 34, 36, 38, and 40 may be typically silicon photovoltaic photocells, the output currents of which drive operational amplifiers 44, 46, 48 and 50 respectively, each configured as a current-to-voltage converter and which presents a load to its respective photocell that is effectively a very low impedence.

To enhance system stability, the operational amplifiers are preferably selected for low input current drift relative to photocell light current levels and amplify each of the photocell outputs.

With the photodetector 34 driving the operational amplifier 44 to provide a substantially sinusoidal analog signal designated "SIGNAL A" and the photodetector 36 driving the operational amplifier 46 to provide analog "SIGNAL B", it should be noted that SIGNAL A and SIGNAL B are 180° out of phase due to the phase displacement between the rulings of the respective grating zones 24 and 26.

Figure 3:
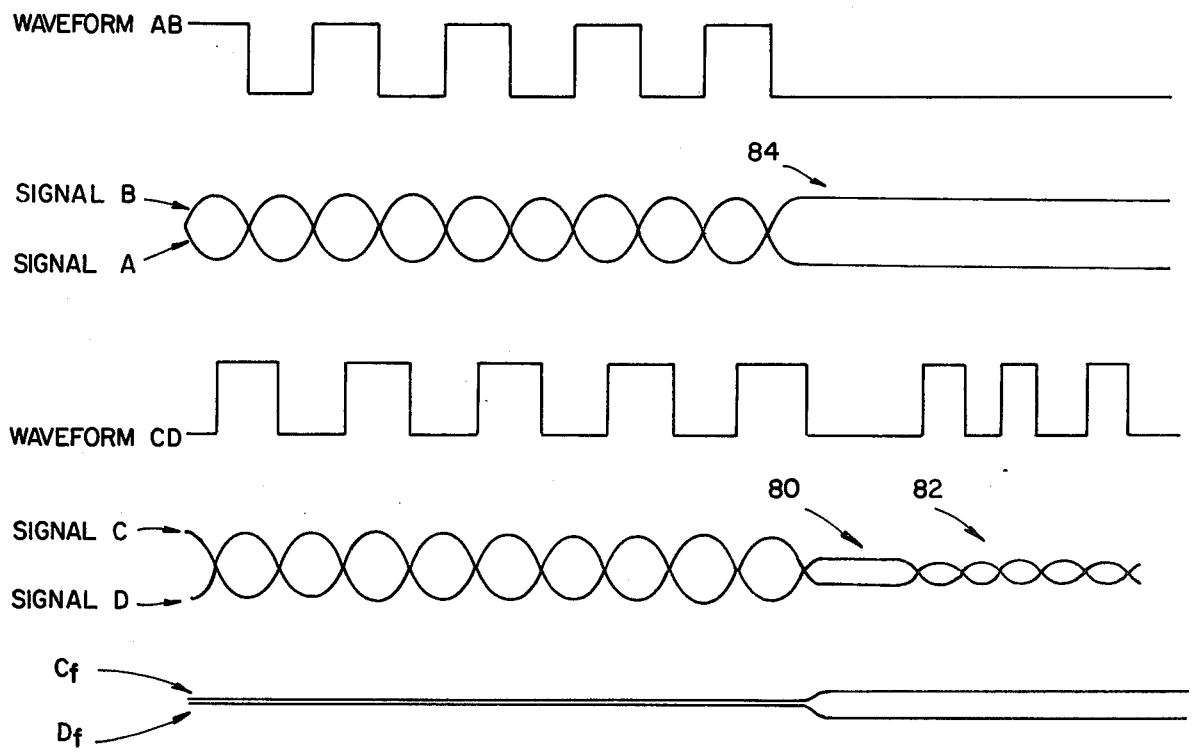
FIG. 3 is a typical waveform timing diagram illustrating two phase quadrature displaced digital signals and the corresponding pairs of 180° phase displaced analog signals from which each digital waveform is derived; also illustrated are the average values of each of the analog signals.

A digital waveform designated "WAVEFORM AB" suitable for providing count signals is derived from SIGNAL A and SIGNAL B at a comparator 52. With reference to FIG. 3, which illustrates SIGNAL A and SIGNAL B as well as WAVEFORM AB which is derived therefrom, it will be seen that a transition edge is formed at WAVEFORM AB upon each half cycle of both SIGNAL A and SIGNAL B with a positive going edge and high pulse in WAVEFORM AB being formed when the value of SIGNAL A exceeds the value of SIGNAL B. At each instance when SIGNAL B exceeds SIGNAL A, a negative going edge and low pulse is formed in WAVEFORM AB.

Similarly, the outputs of the photodetectors 38 and 40 are amplified at the pair of operational amplifiers 48 and 50 respectively to provide "SIGNAL C" and "SIGNAL D" which are phase displaced 180° from each other due to the phase relationship between the rulings of the respective grating zones 28, 30. A further digital waveform designated "WAVEFORM CD" is derived as a function of SIGNAL C and SIGNAL D at a further comparator 54. Referring again to FIG. 3, it will be seen that the comparator 54 provides a positive going edge and high pulse to WAVEFORM CD each time SIGNAL D exceeds SIGNAL C. At each instance that SIGNAL C exceeds SIGNAL D a negative going edge and low pulse is formed.

It should be observed that WAVEFORM AB and WAVEFORM CD are in phase quadrature, that is 90° phase displaced from each other. This phase displacement is a result of the 90° phase displacement between the rulings of grating zone 24 and the rulings of grating zone 28, as well as the 90° phase displacement between the rulings of grating zone 26 and the rulings of grating zone 30. The phase displaced digital waveforms WAVEFORM AB and WAVEFORM CD are thus available for further processing including counting to provide displacement indication in a manner well known in the art, for example as shown in U.S. Pat. No. 2,886,716 or as described in copending application Ser. No. 715,883 previously referred to.

In the postal scale environments, wherein decision application accuracies to one half ounce are necessary, only one of the digital waveforms need be specifically counted for interrogation of quantitative information, while the other waveform provides displacement direction information. By way of example only, WAVEFORM CD is shown as the waveform which is interrogated for quantitative information, while WAVEFORM AB provides direction information only.

Due to the utilization of digital waveforms, precise displacement of the scale tare over an area wherein the digital signal is high or low cannot be determined. For example, in a full cycle of the digital waveform as provided by the movement of the tare structure, a distance equivalent to a single grating ruling corresponds to a tare deflection increment of one ounce of weight, and the maximum resolution provided by the digital waveform being counted is one half ounce. This is because only the high and low portions of the entire one ounce span of the digital waveform cycle can be detected.

In accordance with the present invention, resolution to a higher degree is attainable by selective interrogation of the analog signals from which the digital waveform is derived. The analog waveforms SIGNAL A, SIGNAL B, SIGNAL C, and SIGNAL D, are primarily sinusoidal and provide a substantially linear functional interpolation in areas adjacent the crossover points which represent the decision edges of the corresponding digital waveforms WAVEFORM AB and WAVEFORM CD.

A particular application for interrogation of the analog signals to attain higher resolution is the detection of zero drift whereby the actual tare structure no load position varies from the zero deflection base. Such drift can be due to a number of factors, one of which is the accumulation of dust upon the scale pan.

Referring now to FIG. 4, wherein typical analog signals, SIGNAL C and SIGNAL D are shown progressing through a downcount for one and one-half full cycles, true zero displacement is indicated by a line 56. Actual no load tare displacement, however, has drifted below nominal zero and such additional deflection in an order of magnitude less than one half ounce is indicated at the analog signals SIGNAL C and SIGNAL D by a separation between the values of each signal.

The corresponding digital waveform WAVEFORM CD is shown progressing through its downcount, and it will be seen that WAVEFORM CD does not indicate any zero drift, because pan excursion beyond the nominal zero position did not generate a progression of the analog signals to a successive crossover in values. Thus, the counter only indicates zero displacement, and the true position of the pan cannot be determined from analysis of the WAVEFORM CD.

In accordance with the present invention, the analog signals SIGNAL C and SIGNAL D are first processed to eliminate effects of vibration and provide an indication of their average or steady state values designated $C_f$ and $D_f$. The filtered signals $C_f$ and $D_f$ are derived from the analog signals SIGNAL C and SIGNAL D by passing the analog signals through corresponding three pole Bessel low pass filters designated 56, 58 respectively.

The filters 56, 58 are configured with a low cutoff frequency, in the range of 2 Hz to provide a high degree of attenuation at ground vibration frequencies, for example the 30 Hz range of most rotary machinery, and thus reduce the effects of floor vibration. The three pole Bessel configuration is desirable since it provides a relatively steady output in the face of a sudden input change such as generated from the placement of a large mass on the scale pan 16. In such applications, the use of a Butterworth filter would provide undesirable results, since a sudden input change induces oscillations about a steady state level.

In accordance with the invention, high resolution detection of the zero tare structure drift is achieved by examination of the filtered analog signals $C_f$ and $D_f$ which represent the steady state or average values of SIGNAL C and SIGNAL D respectively.

The differences between the average values of each signal SIGNAL C and SIGNAL D are not desirably measured on an absolute scale because various factors such as temperature, lamp intensity variation due to age, etc. affect signal magnitude.

Instead of measuring the difference of signal values, the ratios of each of the filtered signals $C_f$ and $D_f$ as a function of their amplitude is detected to determine if the filtered signal values are sufficiently close to one another.

A pair of comparators 60, 62 provide an indication of the drift from zero deflection as indicated in the filtered analog signals. As more clearly illustrated in FIG. 5, the comparator 60 compares the signal $C_f$ against a fraction of the signal $D_f$. The fraction is determined by the ratio between a pair of series connected resistors 64, 66 leading from $D_f$ to ground with a tap 67 providing the input to the comparator 60. By way of example, if the resistor 64 is adjusted to a value of 1,000 ohms and the resistor 66 is selected at a value of 9,000 Ohms, the value of the filtered signal $D_f$ appearing at the comparator 60 will be 0.9 $D_f$. The comparator 60 provides an output signal ZERO 1 which is high whenever the filtered signal value $C_f$ exceeds the predetermined fraction of the filtered signal value $D_f$.

Similarly, the comparator 62 indicates the relationship between the filtered signal $D_f$ and a fraction of the filtered signal $C_f$ which fraction is determined by the values placed on a similar pair of series connected resistors 68, 70. The output signal of the comparator 62, ZERO 2, will be high whenever the signal $D_f$ exceeds the predetermined fraction of the filtered signal $C_f$.

Both of the signals ZERO 1 and ZERO 2 are fed to an AND gate 72 whose output signal CLOSE is high when the filtered signal values $C_f$ and $D_f$ are sufficiently close together (as determined by the value of the resistor pairs 64, 66 and 68, 70) such that manual zero correction is not indicated. When CLOSE is low then manual zero correction is indicated, and the operator is thus notified automatically to make a mechanical adjustment of the scale zero position.

Alternately, zero correction can be automatically compensated by a system processor through the use of a memory which stores the difference between the filtered signal values $C_f$ and $D_f$ and then subracts this value from the values of the signals $C_f$ and $D_f$ signal outputs when the scale tare is at rest while carrying a mass. For this purpose, it is necessary to provide additional data to determine the degree of correction necessary, whereas in the system previously described the AND gate 72 only provided the CLOSE signal which indicated that zero drift had exceeded tolerance levels.

In order to indicate the differences between the signals $C_f$ and $D_f$ with such necessary specificity, a plurality of comparator pairs 74, 76, and 78 are provided. Each of the comparator pairs includes comparators identical in configuration to the comparators 60, 62, however the mating resistor pairs differ in resistance values to provide signal pairs ZERO 3, ZERO 4, ZERO 5, ZERO 6 and ZERO 7 ZERO 8, which recognize, in ascending order, greater differences between the values of the filtered analog signals $C_f$ and $D_f$. This is accomplished by having the resistor pairs 74, 76 and 78 valued to pass progressively smaller fractions of the filtered analog signal to the respective comparators. Thus, a plurality of signals are available which enable a system processor to determine the difference between the filtered analog signal value automatically.

It should be appreciated that a greater number of comparator pairs may be utilized to increase the resolution of zero drift detection and corresponding signal compensation by the system processor.

A further instance wherein a high degree of signal resolution is required in scale applications is the occurrence of signal oscillation caused by vibration. Upon placement of a weight on the pan 16 of the scale 10, the scale tare structure 14 is displaced a distance proportional to the weight of the article. While the tare structure is in motion, digital WAVEFORM AB provides a sequence of count pulses to a counter which is initially ascending until maximum displacement has occurred. If the pan overshoots, a descending sequence of counts is produced with the system processor discriminating between ascending and descending sequences through interrogation of the phase relationship between WAVEFORM CD and WAVEFORM AB.

After the tare structure 14 has come to rest, the system counter will not detect further changes unless the tare structure 14 oscillates due to environmental vibration.

When the weight of the article placed upon the scale pan generates a progression of SIGNAL C and SIGNAL D which terminates with the two signals close to a crossover point, e.g. point 80 as indicated in FIG. 3, vibration, if present, may cause subsequent crossings shown in a waveform zone designated 82 in FIG. 3. Such subsequent crossings of the analog signals SIGNAL C and SIGNAL D provide further pulses in WAVEFORM CD which cause the system counter to alternate between successive indicated values.

With the analog signals SIGNAL C and SIGNAL D close to one another, the companion analog signals SIGNAL A and SIGNAL B are approximately 90° phase displaced from a crossover point as shown in zone 84 of the analog signals SIGNAL A and SIGNAL B shown in FIG. 3. Thus there are no further pulses in WAVEFORM AB which indicates that the pulses in WAVEFORM CD represent an oscillation rather than a quantitative advance.

In order to detect which of the alternating values is the correct value, a comparator 86 interrogates the average values of SIGNAL C and SIGNAL D, that is $C_f$ and $D_f$, to determine whether the average value of SIGNAL D is greater than the average value of SIGNAL C.

Assuming now that each of the high segments of WAVEFORM CD represents a one half ounce increment in the detection of the weight of an article and each of the low segments of the waveform represents a successive half ounce which thus indicates a total full ounce increment, it should be appreciated that a positive going edge representing a one half ounce increment is formed each time SIGNAL D is greater than SIGNAL C; similarly, a negative going edge and a full ounce weight increment is indicated each time SIGNAL C is greater in value than SIGNAL D.

The comparator 86 interrogates the average or filtered values of SIGNAL C and SIGNAL D and provides an output signal designated HALF which is high each time the average or filtered value of SIGNAL D exceeds the average or filtered value of SIGNAL C which indicates that the half ounce increment value of two alternating counts should be selected.

In the example illustrated in FIG. 3 it will be seen that the average or filtered value of SIGNAL C is greater than the average or filtered value of SIGNAL D at the vibration zone 84. As a result, the signal HALF will be low and upon interrogation by the system processor, the processor will automatically select the full ounce value of two alternating weight counts.

If, on the other hand, the average or filtered value of SIGNAL D was greater than the average or filtered value of SIGNAL C, the signal HALF would be high and the processor would select the half ounce increment value.

As heretofore mentioned, in the example illustrated only WAVEFOREM CD was providing quantitative information, while WAVEFOREM AB was providing direction information. Further resolution can be provided by utilizing both WAVEFORM AB and WAVEFORM CD to provide quantitative information, whereby the digital system resolution could be increased. In such event, the tracking system of the present invention would provide similar analog interrogation of SIGNAL A and SIGNAL B in a manner identical to that used in processing SIGNAL C and SIGNAL D.

In FIG. 6 an alternate embodiment of the invention is shown wherein like numerals refer to like components as the first embodiment, however bearing the suffix "a". The alternate embodiment shown finds application in digital tracking systems wherein the digital waveforms are generated by a comparison between cyclic signals and a reference level rather than the interrelationships between two 180° phase displaced analog signals.

As shown in FIG. 6, the photodetectors 34a and 38a, identical to the photodetectors 34 and 38 of the prior embodiment, provide 90° phase displaced analog signals in response to the displacement to be measured. The signals of each photodetector 34a, 38a drive an operational amplifier 44a, 48a, respectively, to provide SIGNAL A and SIGNAL C, respectively, which are identical to SIGNAL A and SIGNAL C as generated in the prior embodiment.

SIGNAL A and SIGNAL C are fed to a comparator 52a, 54a, respectively, along with a reference voltage level $V_{ref}$ to generate a pair of quadrature waveforms, WAVEFORM A and WAVEFORM C, respectively. In a manner similar to that discussed with respect to the prior embodiment, resolution of deflected measurement to a degree higher than indicated by successive pulses of the quadrature WAVEFORM C is provided by first filtering SIGNAL C at a filter 58a which may be identical in construction to filter 58 of the prior embodiment.

The filter 58a provides a signal which is indicative of the average value of the corresponding analog signal SIGNAL C, and the filtered or average value signal is fed to a comparator 60a. The comparator 60a additionally receives a reference voltage signal which is a fraction of the signal $V_{ref}$.

A comparator 62a similarly compares the reference voltage $V_{ref}$ with a fraction of the average value of SIGNAL C. An AND gate 72a receiving the signals of both comparators 60a, 62a provides a high signal when the average value of the analog signal SIGNAL C is sufficiently close to the reference voltage such that no zero deflection correction is needed.

Vibration effects at the opposite end of scale pan travel are minimized by a comparator 86a which compares the average value of SIGNAL C generated by the filter 58a with the reference level $V_{ref}$ to determine which of two oscillating count values is to be selected.

Thus, it will be seen that there is provided a digital tracking system with analog signal resolution which achieves the various objects of the present invention and is well suited to meet the conditions of practical use.

As various changes might be made in the system as above set forth, it is to be understood that all matter herein described or shown in the accompanying drawings is to be interpreted as illustrative and not in a limiting sense.

Having thus described the invention, there is claimed as new and desired to be secured by Letters Patent:

1. A digital tracking system for processing cyclic waveforms generated as a function of the change of a bidirectionally variable parameter whose change is to be measured with respect to a reference, the system comprising means receiving a pair of phase displaced cyclic waveforms generated as a function of the change and in response thereto providing a series of pulses each of which is indicative of a quantum of change, and processing means for resolving the measure of change within a a quantum indicated by successive pulses, the processing means receiving the pair of cyclic signals and in response thereto providing a signal responsive to the relative differences between the cyclic signals, wherein the processing means includes a first filter means receiving one of the cyclic signals and in response thereto providing a signal indicative of the average value of the one signal and a second filter means receiving the other cyclic signal and in response thereto providing a signal indicative of the average value of the other cyclic signal, and the processing means provides a signal responsive to the difference between the average value of one of the cyclic signals with respect to the average value of the other.

2. A digital tracking system for processing cyclic waveforms generated as a function of the change of a bidirectionally variable parameter as constructed in accordance with claim 1 wherein the means providing a signal indicative of the difference between the cyclic signals as a function of their amplitude includes a first comparator means adapted to compare the value of the one cyclic signal with respect to a fraction of the value of the other cyclic signal and a second comparator means adapted to compre the value of the other cyclic signal with respect to a fraction of the value of the one cyclic signal.

3. A digital tracking system for processing cyclic waveforms generated as a function of the change of a bidirectionally variable parameter as constructed in accordance with claim 2 wherein the processing means further includes a first filter means, the first filter means receiving one of the cyclic signals and in response thereto providing a signal indicative of the average value of the one signal and a second filter means, the second filter means receiving the other cyclic signal and in response thereto providing a signal indicative of the average value of the other cyclic signal, the first and second comparator means receiving the respective average values and the respective fractions of the average values, whereby the effects of vibration induced errors are reduced.

4. A digital tracking system for processing cyclic waveforms generated as a function of the change of a bidirectionally variable parameter constructed in accordance with claim 1 wherein each of the filter means includes a three pole Bessel filter.

5. A digital tracking system for processing cyclic waveforms generated as a function of a change of a bidirectionally variable parameter whose change is to be measured with respect to a reference, the system comprising means receiving a pair of phase displaced cyclic waveforms generated as a function of the change and in response thereto providing a series of pulses, each of which is indicative of a quantum of change, the means providing the series of pulses being adapted to compare the value of one of the cyclic signals with respect to the value of the other of the cyclic signals and provide a pulse on each occurrence wherein the value of the one signal exceeds the value of the other signal, the system further including processing means for resolving the degree of change within the quantum indicated by successive pulses, the processing means including a first filter means, the first filter means receiving one of the cyclic signals and in response thereto providing a signal indicative of the average value of the one signal and a second filter means, the second filter means receiving the other cyclic signal and in response thereto providing a signal indicative of the average value of the other cyclic signal, comparator means receiving both signals and providing a signal upon each occurrence wherein the average value of the one signal exceeds the average value of the other signal, the filter means being adapted to attenuate the effects of interference, whereby externally induced tracking system oscillation is resolved.

6. A digital tracking system for processing cyclic waveforms generated as a function of a change of a bidirectionally variable parameter constructed in accordance with claim 5 wherein the first and second filter means comprise three pole Bessel type filters.

7. In a digital displacement tracking system comprising a detector having means providing a cyclic signal, the propagation of which is a function of the displacement to be tracked, means receiving the cyclic signal and in response thereto providing a series of pulses, each of which is indicative of a quantum of measured displacement, and counting means receiving the series of pulses and providing a signal indicative of the total measure of displacement as indicated by the series of pulses, the improvement comprising means for resolving the total measure of displacement within the quantum, the resolving means comprising means receiving the cyclic signal and in response thereto providing a signal indicative of the value of the cyclic signal at a terminal of the displacement, wherein the resolving means includes averaging means, the averaging means receiving the cyclic signal and in response thereto providing a signal indicative of the average value of the cyclic signal, the signal indicative of the value of the cyclic signal at a terminal of the displacement being indicative of the average value of the cyclic signal at the terminal whereby the effects of external system interference are reduced.

8. A digital displacement tracking system constructed in accordance with claim 7 including means generating a further signal, the means providing the series of pulses including means receiving the further signal, each pulse of the series being generated as a function of the relationship between the cyclic signal and the further signal, means generating a resolving signal different from the further signal, the resolving means receiving the resolving signal, the signal indicative of the average value of the cyclic signal being generated as a function of the relationship between the average value of the cyclic signal and the resolving signal.

9. A digital displacement tracking system constructed in accordance with claim 8 wherein the means generating the further signal comprises the detector, the further signal comprising a second cyclic signal, the resolving means including means receiving the second cyclic signal and in response thereto providing a signal indicative of the average value of the second cyclic signal.

10. A digital displacement tracking system constructed in accordance with claim 8 wherein the further signal comprises a reference signal and the resolving signal comprises a fraction of the reference signal.

* * * * *